United States Patent
Koinuma et al.

(10) Patent No.: US 6,919,138 B2
(45) Date of Patent: Jul. 19, 2005

(54) TITANIUM DIOXIDE COBALT MAGNETIC FILM AND ITS MANUFACTURING METHOD

(75) Inventors: Hideomi Koinuma, Tokyo (JP); Yuji Matsumoto, Kanagawa (JP)

(73) Assignee: Japan Science and Technology Corporation, Saitama (JP)

( * ) Notice: Subject to any disclaimer, the term of this patent is extended or adjusted under 35 U.S.C. 154(b) by 274 days.

(21) Appl. No.: 10/110,233

(22) PCT Filed: Aug. 17, 2001

(86) PCT No.: PCT/JP01/07089
§ 371 (c)(1),
(2), (4) Date: Apr. 23, 2002

(87) PCT Pub. No.: WO02/18668
PCT Pub. Date: Mar. 7, 2002

(65) Prior Publication Data
US 2003/0091500 A1 May 15, 2003

(30) Foreign Application Priority Data

Aug. 30, 2000 (JP) .................... 2000-261050
Mar. 27, 2001 (JP) .................... 2001-091276

(51) Int. Cl.[7] .............................. B32B 15/00
(52) U.S. Cl. .................. 428/660; 428/686; 428/692; 427/529; 427/128
(58) Field of Search .............. 428/660, 686, 428/692, 611; 427/529, 128; 117/84–109, 944, 949; 423/594.5, 69, 85, 138, 579, 592.1, 592.5, 592.6, 598, 608, 609, 610

(56) References Cited

U.S. PATENT DOCUMENTS 5,145,713 A 9/1992 Venkatesan et al.
5,290,629 A * 3/1994 Kobayashi et al. ........ 428/65.7
6,037,289 A 3/2000 Chopin et al.

FOREIGN PATENT DOCUMENTS

JP 11-92176 4/1999

OTHER PUBLICATIONS

Murakami, M., Matsumoto, Y., Nakajima, K., Makino, T., Segawa, Y., Chikyow, T., Ahmet, P., Kawasaki, M, and Koinuma, H, Appl. Phys. Let., 78(18), Apr. 2001, 2664–2666.*
Chambers, S., Thevuthasan, S., Farrow, R., Marks, R., Thiele, J., Folks, L., Samant, M., Kellock, A., Ruzychki, N., Ederer, D., and Diebold, U., App. Phys. Let., 79(21), Nov. 2001, 3467–3469.*
Matsumoto, Y., Murakami, M., Shono, T., Hasegaw, T., Fukumura, T., Kawasaki, M., Ahmet, P., Chikyow, T., Koshihara, S., and Koinuma, H., Science, Feb. 2001, 291, 854–856.*

* cited by examiner

Primary Examiner—Kevin M. Bernatz
(74) Attorney, Agent, or Firm—Westerman, Hattori, Daniels & Adrian, LLP

(57) ABSTRACT

A mixture of $TiO_2$ and Co is placed in a vacuum chamber under selected oxygen pressure and irradiated in the vacuum chamber with a selected laser light to cause $TiO_2$ and Co to evaporate from the target and a layer of $TiO_2$-Co to epitaxially grow on a heated single crystal substrate. The titanium dioxide-cobalt magnetic film for use in a photocatalyst, a semiconductor material having optical, electrical and magnetic functions, and a transparent magnet. The film is expressed by $Ti_{1-x}Co_xO_2$ where $0<x\leq 0.3$, and wherein a Ti atom at its lattice position is replaced with a Co atom. The film has anatase or rutile crystalline structure, has its band gap energy varying in a range between 3.13 eV and 3.33 eV, retains its magnetization even at a temperature higher than a room temperature, and is transparent to visible light.

15 Claims, 12 Drawing Sheets

(a)

(b)

◯ : O
∘ : Ti (c)

Rutile          Anatase (b) Reflection Electron Beam Diffraction Pattern (a) XRD Diffraction Pattern (a)  (b)

TITANIUM DIOXIDE COBALT MAGNETIC FILM AND ITS MANUFACTURING METHOD

TECHNICAL FIELD

The present invention relates to a titanium dioxide-cobalt magnetic film and a method of its manufacture. The invention further relates to a material useful to form a photocatalyst, a semiconductor material having an optical, an electrical and a magnetic function all together and a transparent magnet utilizing such a magnetic film, and a method of its manufacture.

BACKGROUND ART

Titanium dioxide ($TiO_2$) is a material that has been put to practical use for the photodecomposition of water and the decomposition and removal of a hazardous substance, and further improvements in the photocatalytic activity of titanium dioxide are now demanded from the standpoint of energy and environmental problems.

Also, as semiconductors, Si and GaAs are now in the mainstream. While these conventional semiconductors are materials capable of realizing electrical functions by carrier control, or photoelectric functions as in laser diodes and photodiodes, there has been made available no semiconductor material that can realize a magnetic function as with a magnetic memory. Titanium dioxide is a semiconductor crystal which with its band gap in the ultraviolet range has a photoelectric function. If given a magnetic function anew and left to continue to possess the photoelectric function, then this material could become a semiconductor material that is capable of realizing an optical, an electrical and a magnetic function all together.

A material so far called a magnet is a substance that does not transmit a visible light and hence is black. If a transparent magnet is realized, then such magnets will unquestionably be useful over diverse fields of industry, not to speak of their good serviceability in paper clips.

By the way, the prior art where it is designed to impart magnetism to a transparent insulator includes a technique illustrated in FIG. 14. A powder of a nonmagnetic insulator, such as $Al_2O_3$, transparent to a visible light is mixed with particles of a magnetic metal such as Co or the like, and the mixture is then sintered. In a transparent magnet so prepared, increasing the magnetic metal particles in amount brings about amorphization of the nonmagnetic insulator due to the presence of the magnetic metal particles, and let it lose its crystallinity, thus the transparency and insulating properties which the transparent insulator as the matrix originally possesses.

As a magnetic semiconductor there exists now a mixture of GaAs with Mn as well as a CdMnTe material, and there is indeed a material having a magnetic function and further an optical function as the Faraday rotation. But none of these conventional magnetic semiconductors is transparent to a visible light, however.

Thus, no semiconductor material has hitherto existed or been made available that is transparent to a visible light and possesses a magnetic function.

In view of the problems mentioned above, it is an object of the present invention to provide the titanium dioxide-cobalt magnetic film and the method of its manufacture, the titanium dioxide-cobalt magnetic film having a magnetic function added to, and without losing the crystallinity of titanium dioxide, and being usable as a semiconductor possessing an optical, an electrical and a magnetic function all in combination, and a transparent magnet as well.

DISCLOSURE THE INVENTION

In order to achieve the object mentioned above, there is provided in accordance with the present invention a titanium dioxide-cobalt magnetic film characterized by a composition expressed by chemical formula: $Ti_{1-x}Co_xO_2$ where $0<x\leq0.3$, in which a Ti atom at its lattice position is replaced with a Co atom, and the said magnetic film is a film epitaxially grown on a single crystal substrate.

Preferably, the said magnetic film has its crystalline structure that is anatase or rutile structure.

The said magnetic film of anatase structure may be characterized in that it has its band gap energy varying in a range between 3.13 eV and 3.33 eV according to the concentration of Co atoms replaced for Ti atoms at their lattice positions.

The said titanium dioxide-cobalt magnetic film is capable of retaining its magnetization even at a temperature higher than a room temperature, and is also transparent to a visible light.

The said single crystal substrate may be a $LaAlO_3$ (001) substrate if the said crystalline structure is anatase structure.

The said single crystal substrate may be an $Al_2O_3$ substrate if the said crystalline structure is rutile structure.

If the said crystalline structure is rutile structure, the said single crystal substrate may also be a $TiO_2$ substrate having rutile crystalline structure.

A titanium dioxide-cobalt magnetic film of the makeup mentioned above has a magnetic function added to, and without losing the crystallinity of titanium dioxide, and thus is usable as a semiconductor possessing an optical, an electrical and a magnetic function all in combination, and as a transparent magnet as well.

There is also provided in accordance with the present invention a method of making a titanium dioxide-cobalt magnetic film, characterized in that it comprises the steps of: preparing a target having $TiO_2$ and Co mixed together at a selected mixing ratio, and placing a single crystal substrate and the said target in a vacuum chamber provided with an atmosphere with a selected oxygen pressure therein; and in the said vacuum chamber, heating the said substrate to a selected substrate temperature and irradiating the said target with a selected laser light under selected irradiating conditions to cause said $TiO_2$ and Co to evaporate from the said target and a film of $TiO_2$-Co to grow on the said heated single crystal substrate.

Preferably, the said selected oxygen pressure ranges between $10^{-5}$ and $10^{-6}$ Torr, the said selected substrate temperature ranges between 500 and 700° C., the said selected laser light is a Kr-excimer laser light applied in the form of a succession of laser pulses, and the said selected irradiating conditions include a per pulse power density of the said laser light ranging from 1 to 2 joules/cm² and a rate of irradiation with the laser pulses ranging between 1 and 10 Hz.

The method mentioned above may further comprise preparing a second target composed exclusively of $TiO_2$ and placing the said second target in the said vacuum chamber, and irradiating the first mentioned target and the said second target alternately with laser pulses of the said selected laser light at a selected ratio in number corresponding to a selected concentration of Co in $TiO_2$-Co composing said film, thereby permitting a film of $TiO_2$-Co with Co substantially at the said selected Co concentration to grow on the said heated single crystal substrate.

The method with the makeup mentioned above permits making the titanium dioxide-cobalt magnetic film having a desired Co concentration.

A titanium dioxide-cobalt magnetic film of the present invention can be used to make up a photocatalyst having high catalytic activity.

A titanium dioxide-cobalt magnetic film of the present invention can be used as a semiconductor material possessing an optical, an electrical and a magnetic function all together or in combination as desired.

A titanium dioxide-cobalt magnetic film of the present invention can be used to make up a transparent magnet that can be used, e.g., as a paper clip.

BRIEF DESCRIPTION OF THE DRAWINGS

The present invention will better be understood from the following detailed description and the drawings attached hereto showing certain illustrative forms of embodiment of the present invention; in this connection, it should be noted that such forms of embodiment illustrated in the accompanying drawings hereof are intended in no way to limit the present invention but to facilitate an explanation and understanding thereof.

In the drawings.

BEST MODES FOR CARRYING OUT THE INVENTION

Hereinafter, an explanation is given in respect of suitable forms of embodiment of the titanium dioxide-cobalt magnetic film of the present invention with reference to FIGS. 1 to 13.

Figure 1:
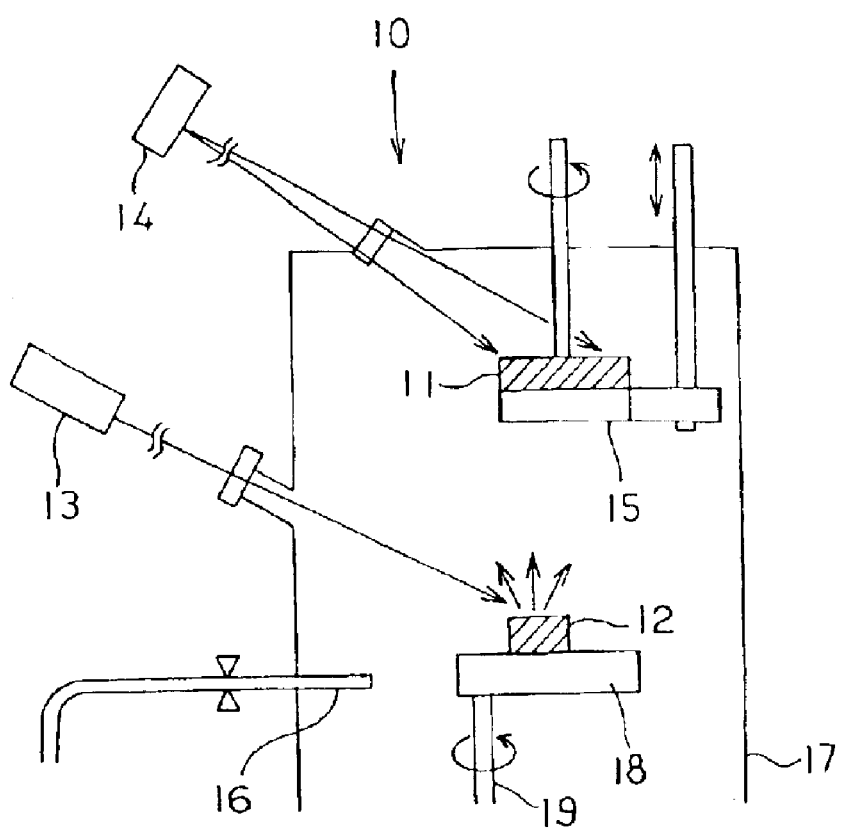
FIG. 1 is a diagrammatic view of an apparatus for making a titanium oxide-cobalt magnetic film according to the present invention.

FIG. 1 is a diagrammatic view of an apparatus for manufacturing a titanium dioxide-cobalt magnetic film.

Referring to FIG. 1, the apparatus, designated by reference character 10, is configured to perform laser ablation deposition, and includes a vacuum chamber 17 in which a substrate 11 and a target 12 disposed in opposition thereto are mounted. Included also in the apparatus 10 are a laser system 13 for irradiating the target 12 with a pulsed laser through a window from the outside of the vacuum chamber 17, and a heating device 14 for heating the substrate 11. Further, adjacent to that surface of the substrate 11 which is opposed to the target 12, a mask is movably supported to cover the substrate partially therewith. Shown by reference character 16 is a nozzle for introducing oxygen.

The substrate 11 if a titanium dioxide-cobalt magnetic film of anatase crystalline structure is to be epitaxially grown thereon is constituted by a LaAlO$_3$ (001) substrate that is relatively small in lattice misfit, transparent and shaped to expose a (001) crystallographic face on its surface. On the other hand, the substrate 11 if a titanium dioxide-cobalt of rutile crystalline structure is to be epitaxially grown thereon may be constituted by an Al$_2$O$_3$ single crystal substrate, or a TiO$_2$ single crystal substrate having a rutile crystalline structure.

The target 12 is formed by, for example, a TiO$_2$ material having a rutile crystalline structure doped with Co in an amount of 10% by mol and sintered at a temperature of 1000° C.

In an alternative arrangement, instead of one target 12 it is also possible and advantageous to use a pair of targets, one of which may be the target mentioned above and the other a target made of only TiO$_2$ of rutile crystalline structure, and to alternately irradiate them with laser light pulses at a preselected ratio in number. In this case, the targets may be held on a multi-target holder 18 capable of supporting a plurality of such targets, and a rotary shaft 19 operated so that each target is selectively brought in thereby to occupy a laser irradiated position of the laser system 13.

The laser used with the laser system 13 for irradiation may be, for example, a KrF excimer laser emitting a laser light of 248 nm in wavelength, which is here pulsed to provide a succession of laser light pulses at a rate of 1 to 10 in number per second, namely 1 to 10 Hz, with the light energy density of each single such laser pulse adjusted at 1 to 2 joules per square centimeter.

The heating device 14 may be an ordinary lamp heater, but if constituted by a substrate heating device using a Nd: YAG laser, is capable of heating the substrate 11 to an elevated temperature even if its surrounding atmosphere is oxidizing.

The vacuum chamber in its interior is first held at a vacuum around $1 \times 10^{-9}$ Torr, and then is charged with oxygen via a gas inlet valve 16 to have an oxygen partial pressure of $10^{-5}$ to $10^{-6}$ Torr.

Figure 2:
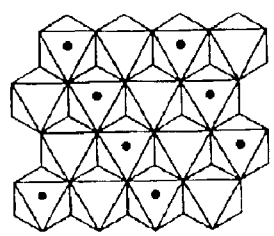
FIG. 2 contains diagrams typically illustrating anatase and rutile crystalline structures of titanium dioxide.
Figure 2:
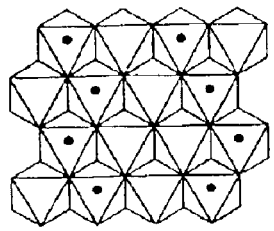
Figure 2:
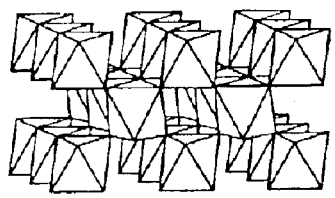
Figure 2:
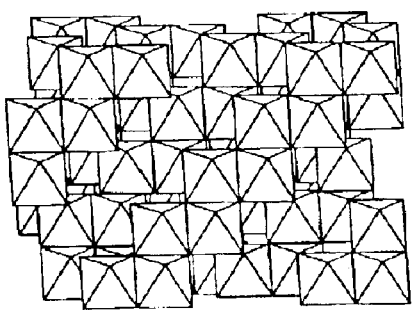
Figure 2:
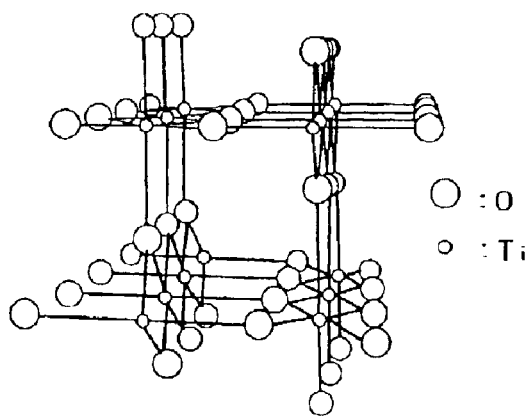
Figure 2:
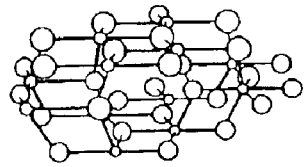

Mention is next made of crystalline structures of a titanium dioxide-cobalt magnetic film according to the present invention. FIG. 2 typically shows possible crystalline structures of a titanium dioxide, in which FIG. 2(*a*) illustrates Ti coordinated positions (each indicated by a dark circle) in both anatase and rutile crystalline structures thereof, FIG. 2(*b*) typically illustrates how the octahedral ligands made of Ti and O are arranged in the anatase and rutile crystalline structures, and FIG. 2(*c*) illustrates a model of Ti—O ball-and-spoke model in the anatase and rutile crystalline structures.

Figure 3:
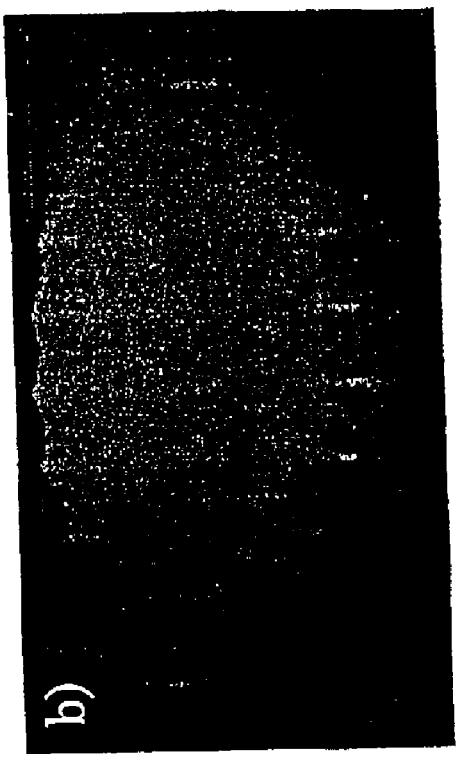
FIG. 3 contains diagrams illustrating results of X-ray diffraction analysis for a titanium dioxide-cobalt magnetic film of anatase crystalline structure made by the method of manufacture according to the present invention.
Figure 3:
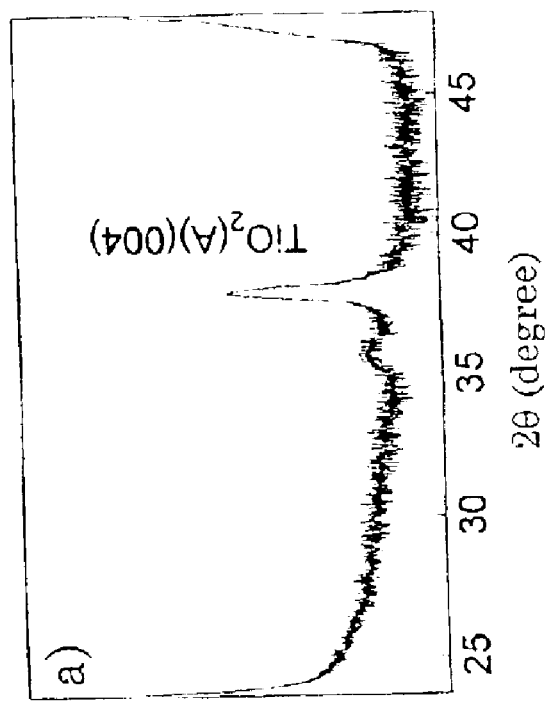

FIG. 3 shows results of measurement by the X-ray diffraction analytical for a titanium dioxide-cobalt magnetic film of the anatase crystalline structure made by the method of manufacture according to the present invention, in which FIG. 3(*a*) shows a diffraction pattern by XRD (X-Ray Diffraction Meter), and FIG. 3(*b*) shows results of measurement by RHEED (Reflection High-Energy Electron Diffraction) analysis for the film grown.

The titanium dioxide-cobalt magnetic film used in the measurement is one with Co contained at a concentration of 5.8%, which was grown on a $LaAlO_3$ (001) substrate when a first target composed of $TiO_2$ of rutile crystalline structure doped with Co in an amount of 10% by mol and a second target composed entirely of $TiO_2$ of rutile crystalline structure were alternately irradiated with laser light pulses at a fixed ratio in number. The Co concentration was determined by the EPMA (Electron Probe Micro-Analysis). The substrate temperature and the oxygen partial pressure were 650° C. and $10^{-5}$ Torr, respectively.

From the diffraction pattern shown in FIG. 3(*a*), it is seen that the titanium oxide-cobalt magnetic film, made by the method of manufacture of the present invention, has the anatase crystalline structure and the c-axis is oriented perpendicular to the substrate purface. Also, from the RHEED measurement results shown in FIG. 3(*b*) it is seen that the film had an epitaxial growth for each single molecular layer.

Figure 4:
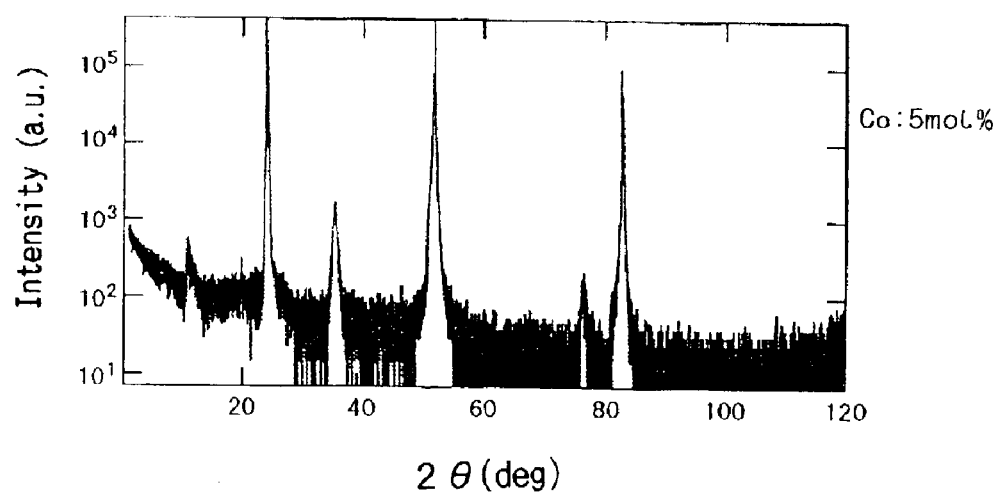
FIG. 4 is a diagram illustrating results of measurement by X-ray diffraction analysis for a titanium dioxide-cobalt magnetic film of rutile crystalline structure made by the method of manufacture according to the present invention.

FIG. 4 shows results of measurement by the X-ray diffraction analysis for a titanium dioxide-cobalt magnetic film of the rutile crystalline structure made by the method of manufacture of the present invention.

The titanium dioxide-cobalt magnetic film of rutile crystalline structure is made under the same conditions as used in making the titanium dioxide-cobalt magnetic film of anatase crystalline structure mentioned above, except the single crystal substrate for epitaxial growth is an $Al_2O_3$ substrate or a $TiO_2$ substrate of rutile crystalline structure.

From the diffraction pattern shown in FIG. 4, it is seen that the titanium oxide-cobalt magnetic film, made by the method of manufacture of the present invention, has the rutile crystalline structure and the <101> axis is oriented perpendicular to the substrate purface. Also, although not shown, it has been confirmed that the film had an epitaxial growth for each single molecular layer.

Figure 5:
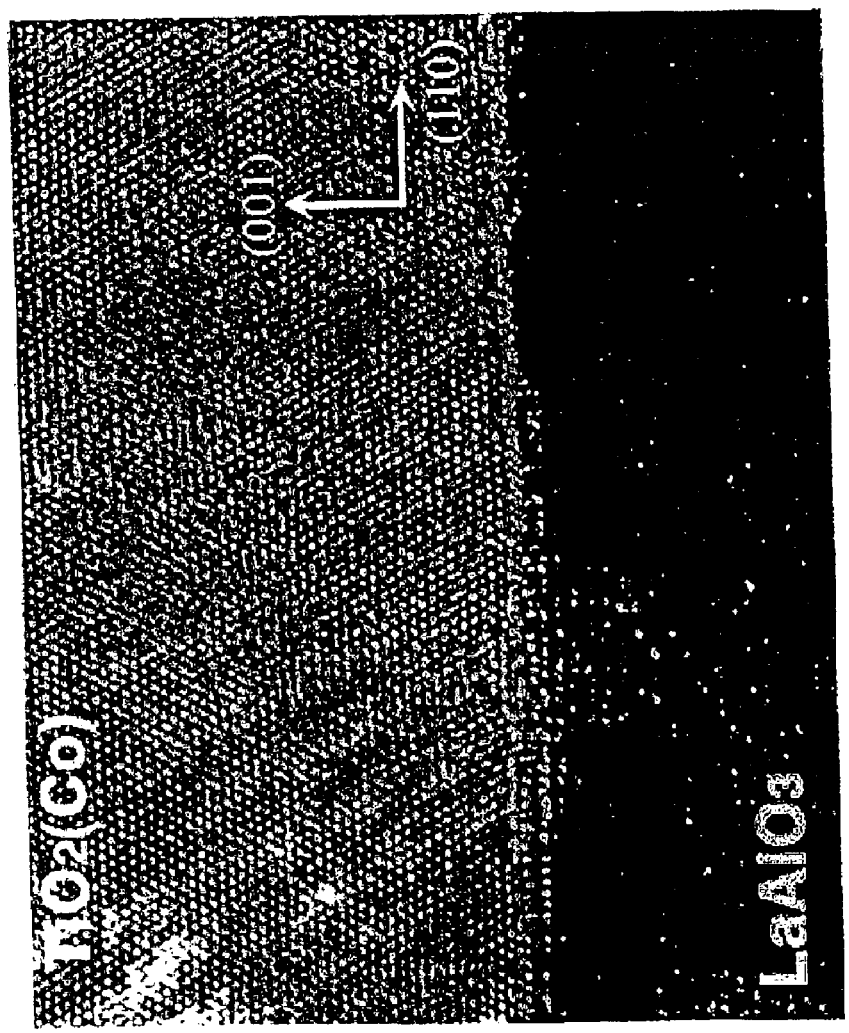
FIG. 5 is a diagram illustrating results of measurement by TEM (Transmission Electron Microscope) for a titanium dioxide-cobalt magnetic film of anatase crystalline structure, made by the method of manufacture of the present invention, taken for its cross section.

FIG. 5 is a diffraction image (pattern) showing results of measurement by the TEM (Transmission Electron Microscope) for the titanium dioxide-cobalt magnetic film of anatase crystalline structure mentioned above, taken for its cross section. As is evident from the image of FIG. 5 in which diffraction dots are found which are orderly arranged according to the Ti and Co lattice arrangements, it is seen that in a titanium dioxide-cobalt magnetic film of anatase crystalline structure of the present invention, a Co atom is substituted for a Ti atom at its lattice point. Also, although the illustration is omitted, it has been confirmed that in a titanium dioxide-cobalt magnetic film of rutile crystalline structure of the invention as well, a Co atom is substituted for a Ti atom at its lattice point.

Figure 6:
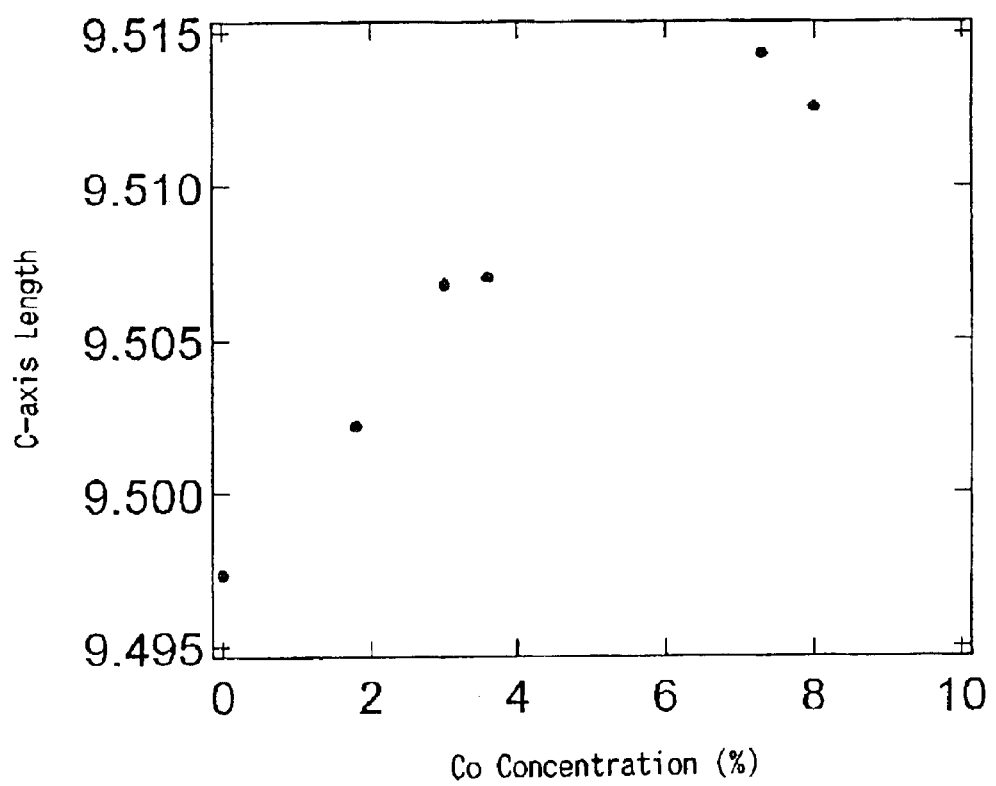
FIG. 6 is a graph showing results of measurement for the lattice constant in the direction of c-axis of a titanium dioxide-cobalt magnetic film of anatase crystalline structure, the measurement being taken for titanium dioxide-cobalt magnetic films of anatase crystalline structure made with the Co concentration varied variously in accordance with the present invention.

FIG. 6 is a graph showing results of measurement for the lattice constant in the direction of c-axis of a titanium dioxide-cobalt magnetic film of anatase crystalline structure, the measurement being taken for titanium dioxide-cobalt magnetic films of anatase crystalline structure made with the Co concentration varied variously. From the graph of FIG. 6, it is seen that the lattice constant largely changes substantially in proportion to the Co concentration. From these results, too, it is made out that a Ti atom at its lattice point is replaced with a Co atom.

From FIGS. 5 and 6, it is evidently demonstrated that a titanium dioxide-cobalt magnetic film according to the present invention in spite of containing magnetic Co atoms retains a semiconductor crystalline structure.

Figure 7:
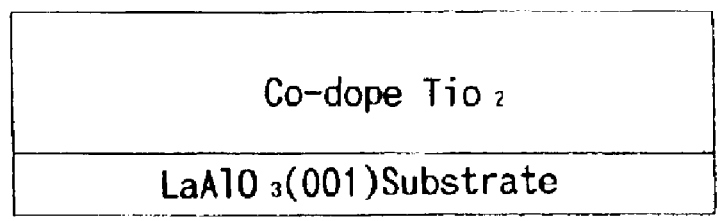
FIG. 7 is a graph showing results of measurement for the optical transmittance of a titanium dioxide-cobalt magnetic film of anatase crystalline structure with Co contained at a concentration of 8% according to the present invention.
Figure 7:
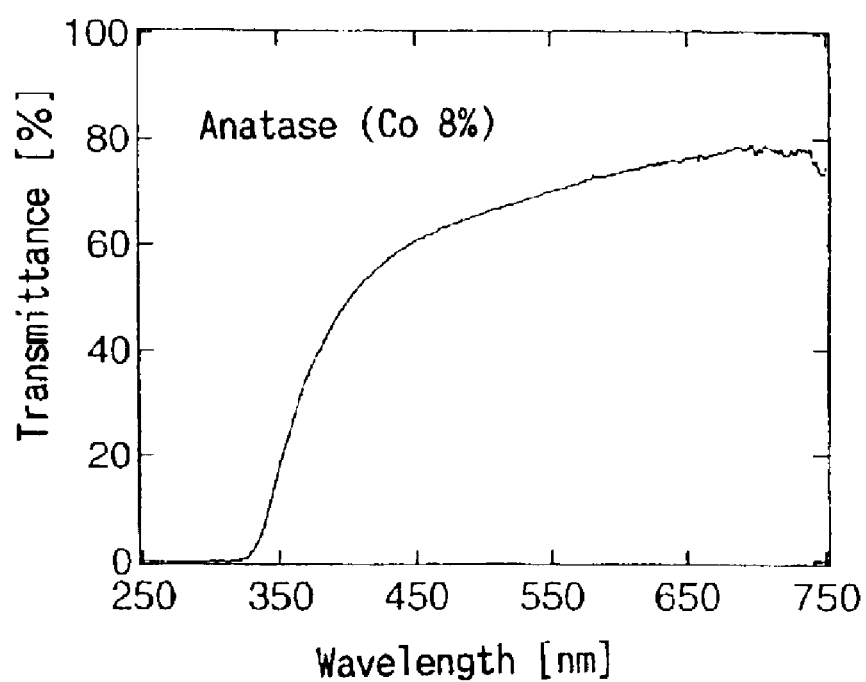

FIG. 7 is a graph showing results of measurement for the transmittance of a titanium dioxide-cobalt magnetic film of anatase crystalline structure of the type mentioned above and with Co contained at a concentration of 8%. From this graph, it is seen that the titanium dioxide-cobalt magnetic film, of the present invention, is transparent to a visible light. Also, while the illustration is omitted, it has been confirmed that a titanium dioxide-cobalt magnetic film of rutile crystalline structure as well is transparent to a visible light.

Figure 8:
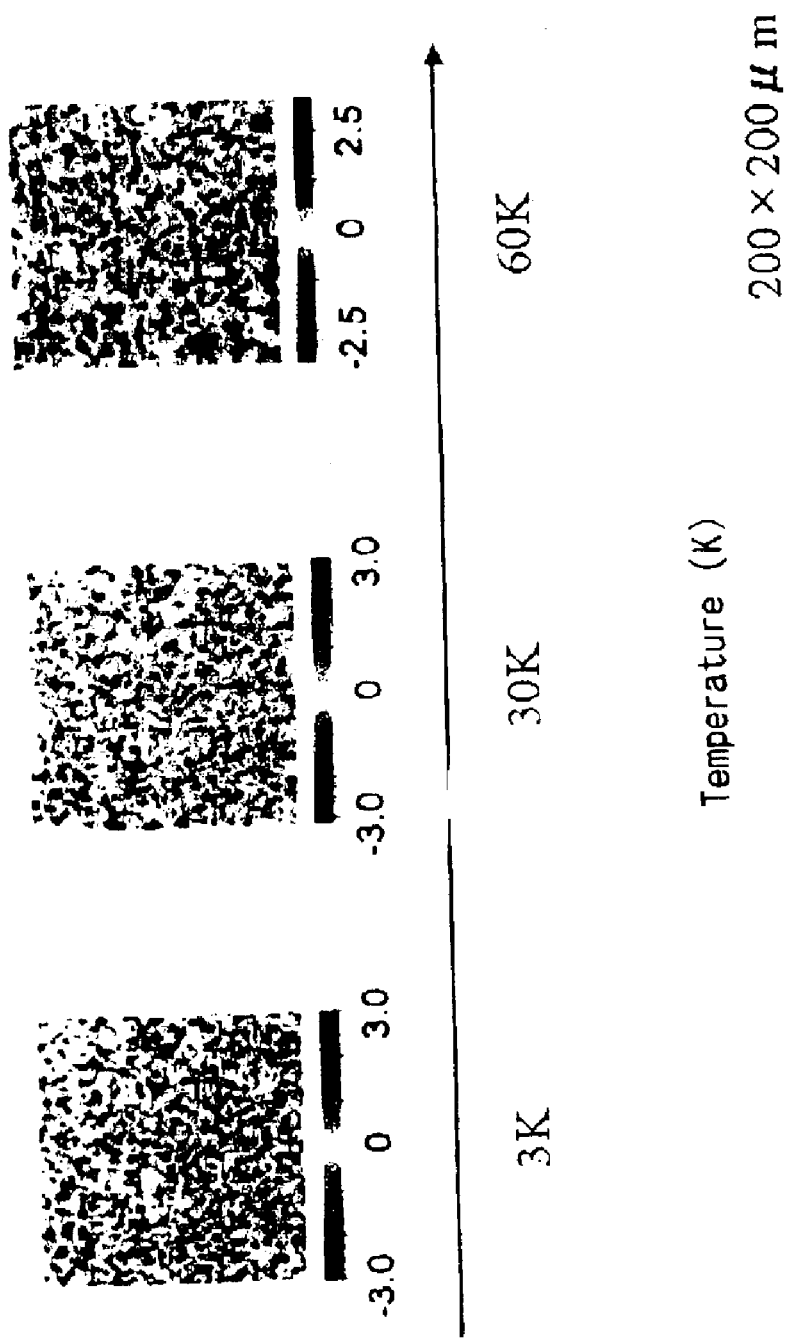
FIG. 8 is an image diagram showing the magnetic domain structure of a titanium dioxide-cobalt magnetic film of anatase crystalline structure, the images being taken using a scanning SQUID microscope.

FIG. 8 is an image diagram showing in images, results of measurement for the magnetic domain structure of a titanium dioxide-cobalt magnetic film of anatase crystalline structure, the images being taken using a scanning SQUID microscope.

In FIG. 8, the concentration scale taken along the axis of abscissa represents the strength of magnetization expressed in Tesla, and signs + and − represent directions of magnetization. In this measurement made using the scanning SQUID microscope, the three images are taken over an area of 200 $\mu$m×200 $\mu$m at measurement temperatures of 3 K, 30 K and 60 K, respectively.

Figure 9:
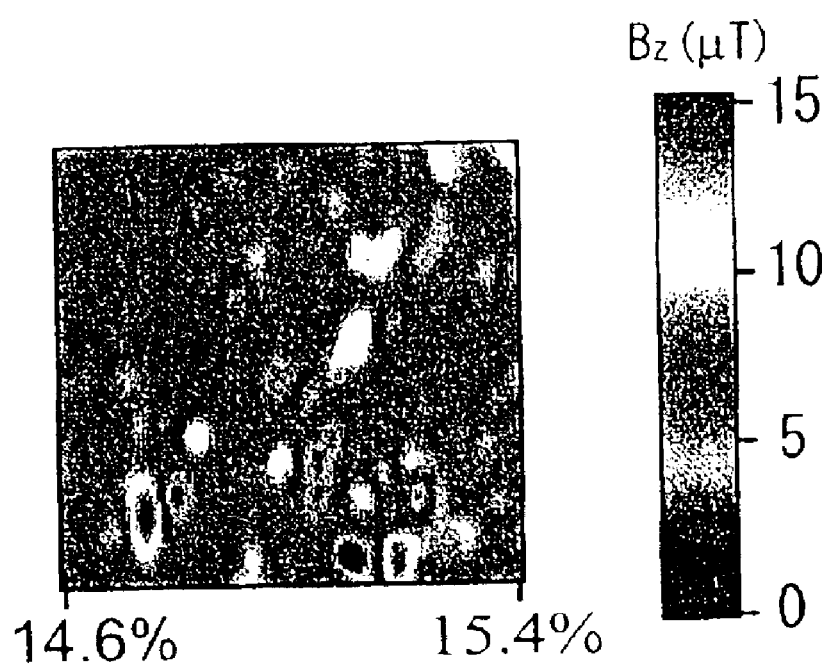
FIG. 9 is an image diagram showing the magnetic domain structure of a titanium dioxide-cobalt magnetic film of rutile crystalline structure, the image being taken using a scanning SQUID microscope.

FIG. 9 is an image diagram showing in an image, results of measurement for the magnetic domain structure of a titanium dioxide-cobalt magnetic film of rutile crystalline structure, the images being taken using a scanning SQUID microscope.

In the Figure, the concentration scale taken along the axis of abscissa represents the strength of magnetization expressed in Tesla. The image is taken at a measurement temperature of 3 K over an area of 200 $\mu$m×200 $\mu$m.

The titanium dioxide-cobalt magnetic film of rutile crystalline structure used in this measurement is made with the Co concentration varied from 14.6% at the left hand side continuously to 15.4% at the right hand side of the picture.

Figure 10:
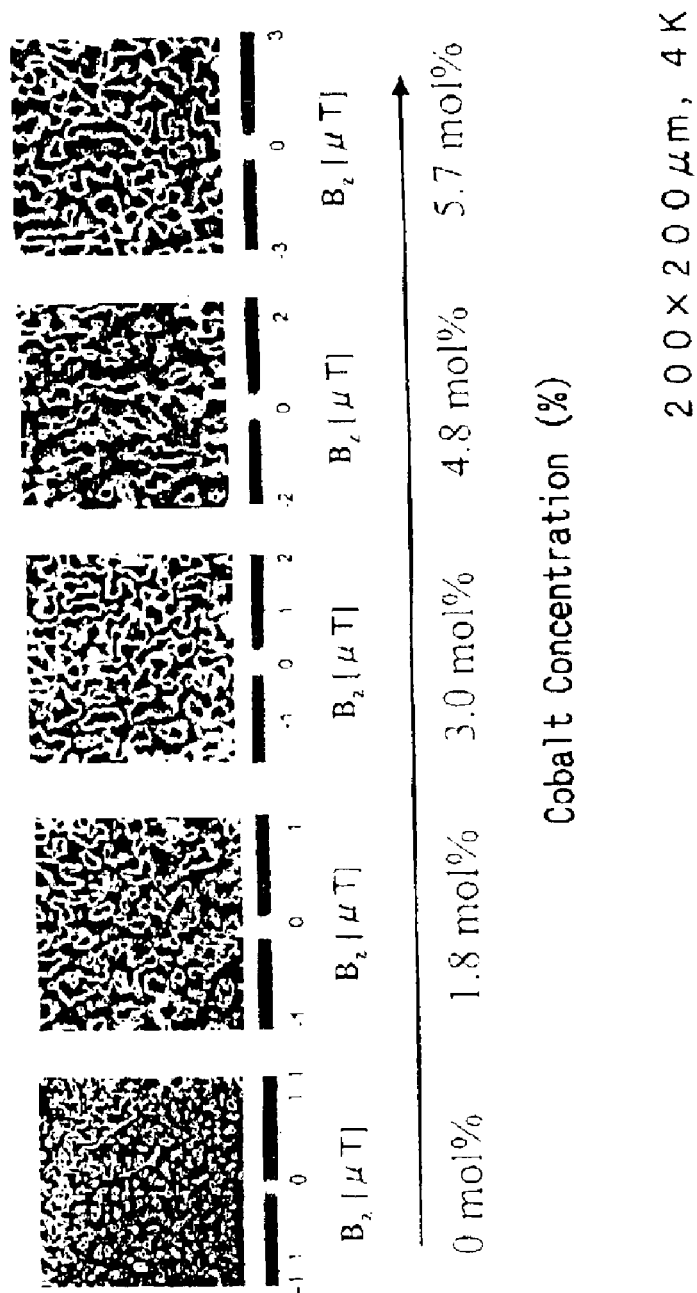
FIG. 10 shows the magnetic domain structure of the titanium dioxide-cobalt magnetic film of anatase crystalline structure containing Co at various concentrations, the image is observed using the scanning SQUID microscope.
Figure 11:
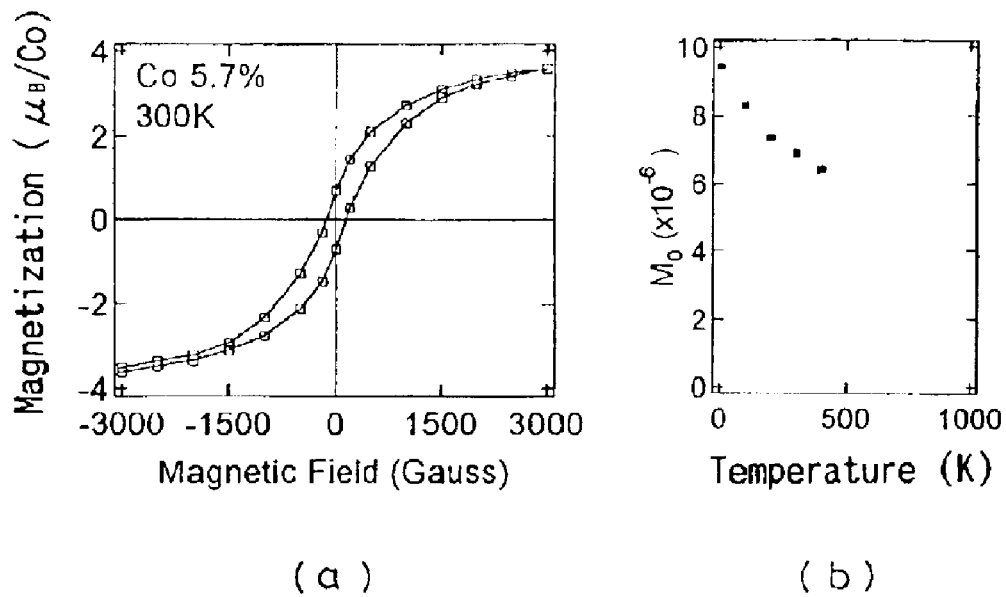
FIG. 11 contains graphs showing magnetic hysteresis properties of a titanium dioxide-cobalt magnetic film of anatase crystalline structure of the present invention.

FIG. 10 shows results of the measurement in which the magnetic domain structure or pattern of the titanium dioxide-cobalt magnetic film of anatase crystalline structure containing Co at various concentrations is observed using the same means as described in connection with FIG. 8. In the Figure, the concentration scale taken along the axis of abscissa represents the strength of magnetization expressed in Tesla, and signs + and − represent directions of magnetization. From FIG. 10, it is made out that the magnetization increases as the Co concentration is increased, FIG. 11 contains graphs showing magnetic properties of the titanium dioxide-cobalt magnetic film of anatase crystalline structure mentioned above, where FIG. 11(a) is a graph showing its hysteresis characteristics with the axis of ordinate representing the magnetic moment for one Co atom in $\mu$B unit and the axis of abscissa representing the strength of the magnetic field applied to the magnetic film in a direction parallel to a surface thereof at a temperature of 300 K, and FIG. 11(b) is a graph showing the residual magnetic moment characteristic as a function of the temperature, namely demagnetization characteristic of temperature.

Figure 12:
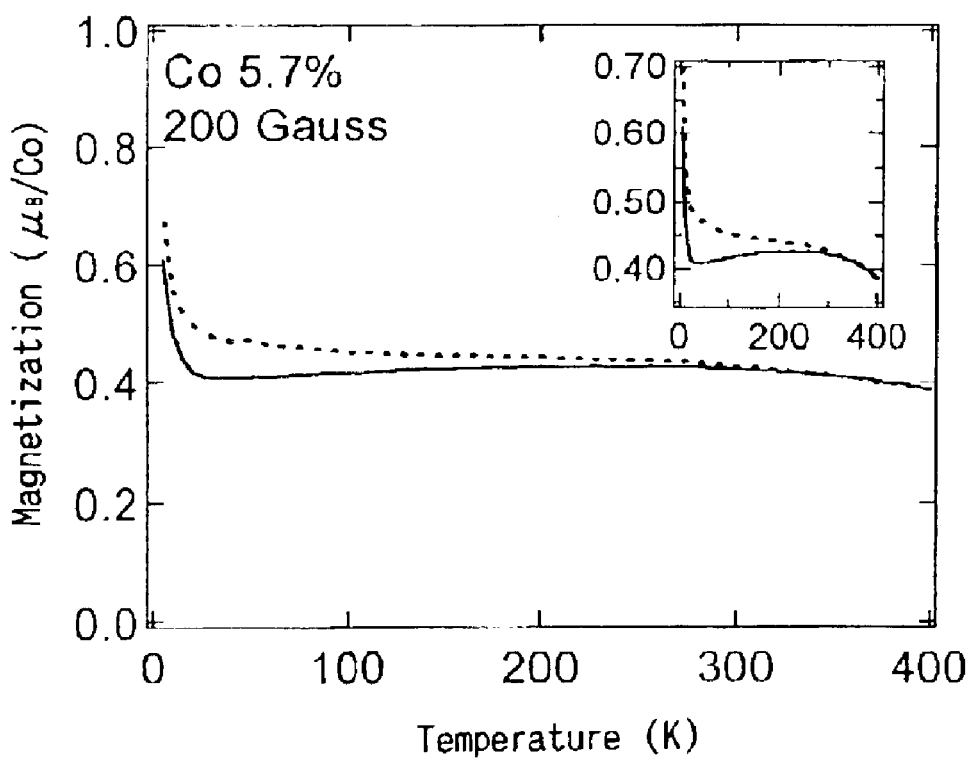
FIG. 12 is a graph showing the temperature dependency of the magnetization characteristic of a titanium dioxide-cobalt magnetic film of anatase crystalline structure of the present invention.

FIG. 12 is a graph showing the temperature dependency of the magnetization characteristic of the titanium dioxide-cobalt magnetic film of anatase crystalline structure mentioned above. The strength of the magnetic field applied is 200 Gauss, and the measurement temperatures range from 0 to 400 K.

As is apparent from FIGS. 7 to 12, a titanium dioxide-cobalt magnetic film has a magnetic domain structure, whose magnetization increases as the Co concentration is increased. It is also possible to bring about residual magnetization, and thus to magnetize the film, in a temperature range between 0 and 400 K. Moreover, the magnetization does not vanish even at a temperature as high as 400 K.

Figure 13:
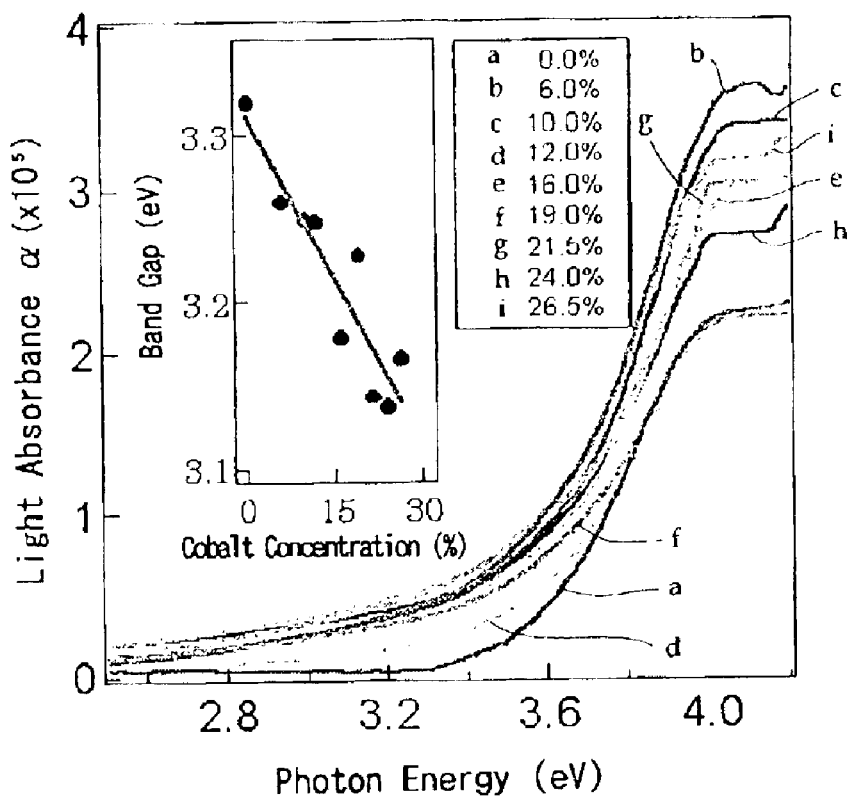
FIG. 13 is a graph showing light absorption characteristics of a titanium dioxide-cobalt magnetic film of anatase crystalline structures of the present invention with the Co concentration varied.

FIG. 13 is a graph showing light absorption characteristics of the titanium dioxide-cobalt magnetic film of anatase crystalline structures of the present invention with the Co concentration varied- Each of the absorption curves shown indicates that these magnetic films are of a good semiconductor crystal. From the absorption edges, band gap energy levels of 3.13 to 3.33 eV can be derived.

Figure 14:
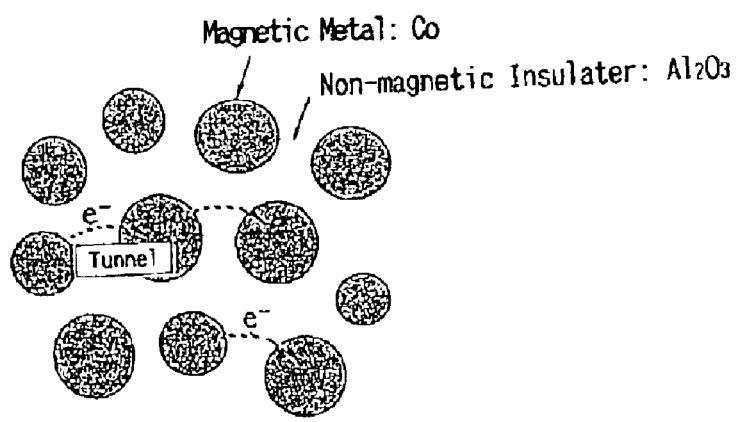
FIG. 14 is a diagram illustrating the prior art used when an attempt is made to add magnetism to a transparent insulator.

From FIG. 14, it is evidently seen that a titanium dioxide-cobalt magnetic film of the present invention is of a semiconductor crystal whose band gap energy varies in level with the concentration of cobalt incorporated.

As will be understood from the foregoing description, the present invention provides a titanium dioxide-cobalt magnetic film that is of a semiconductor crystalline structure in which a Ti atom at its lattice point is replaced with a Co atom, and which has a magnetic domain structure capable of bringing about residual magnetization that does not disappear even at a temperature of 400 K. Further, the magnetic film is transparent to a visible light and has its band gap energy variable with the concentration of Co doped. Also, the method of manufacture to make a titanium dioxide-cobalt magnetic film according to the present invention enables a titanium dioxide-cobalt magnetic film of the invention to be made reliably.

The photocatalytic reaction by $TiO_2$ is an oxidation-reduction reaction by holes and free electrons produced upon the absorption of photons having energy greater in level than the band gap energy of $TiO_2$. A high possibility exists, however, that these holes and free electrons if so produced may be recombined immediately upon their production. While for this reason and others, high efficiency of the photocatalytic reaction has not so far been obtained, it has been found that the use of a titanium dioxide-cobalt magnetic film for photocatalyst permits the magnetization by Co to reduce the recombination of the holes and the electrons, thus to achieve an enhanced efficiency of the photocatalytic reaction.

Regarding data for use in a computer or the like, it has been the common practice to store and retain them in a thin magnetic disc, requiring that such a storage be disposed outside of its CPU and that a mechanical drive be also provided. While these requirements have made the computer or the like poor in compactness and reliability, the use of titanium dioxide-cobalt magnetic films as semiconductors to build a data storage device will permit the CPU and the data storage device to be integrated together on a common substrate, thus enhancing the compactness and reliability of an apparatus of this type. Further, if the unique use is to be made of its transparency, it is expected that the invention will also find its application as a material to build transparent elements or devices such as transparent displays or electronic papers in circuits, drives and so forth.

INDUSTRIAL APPLICABILITY

As described above, a titanium dioxide-cobalt magnetic film of the present invention can be used to obtain a photocatalyst of high catalytic capability, a semiconductor materials possessing an optical, an electrical and a magnetic function all in combination, and a transparent magnet.

Further, the method of manufacture of a titanium dioxide-cobalt magnetic film in accordance with the present invention can be used to reliably manufacture the above mentioned titanium dioxide-cobalt magnetic film.

What is claimed is:

1. A titanium dioxide-cobalt magnetic film having a composition expressed by chemical formula: $Ti_{1-x}Co_2O_2$ where $0<x\leq0.3$, wherein a Ti atom at its lattice position is replace with a Co atom, and said magnetic film epitaxially grown on a single crystal substrate.

2. A titanium dioxide-cobalt magnetic film as set forth in claim 1, characterized in that said magnetic film has its crystalline structure that is anatase structure.

3. A titanium dioxide-cobalt magnetic film as set forth in claim 1, characterized in that said magnetic film has its crystalline structure that is rutile structure.

4. A titanium dioxide-cobalt magnetic film as set forth in claim 1 or 2, characterized in that said magnetic film has its band gap energy varying in a range between 3.13 eV and 3.33 eV according to the concentration of Co atoms replaced for Ti atoms at their lattice positions.

5. A titanium dioxide-cobalt magnetic film as set forth in any one of claims 1 to 3, characterized in that said magnetic film is capable of retaining its magnetization even at a temperature higher than a room temperature, and is also transparent to a visible light.

6. A titanium dioxide-cobalt magnetic film as set forth in claim 1 or 2, characterized in that said single crystal substrate is a $LaAlO_3$ (001) substrate.

7. A titanium dioxide-cobalt magnetic film as set forth in claim 1 or 3, characterized in that said single crystal substrate is an $Al_2O_3$ substrate.

8. A titanium dioxide-cobalt magnetic film as set forth in claim 1 or 3, characterized structure.

9. A method of making a titanium dioxide-cobalt magnetic film, characterized in that it comprises the steps of:

preparing a target having $TiO_2$ and Co mixed together at a selected mixing ratio, and placing a single crystal substrate and said target in a vacuum chamber provided with an atmosphere with a selected oxygen pressure therein; and in said vacuum chamber, heating said substrate to a selected substrate temperature and irradiating said target with a selected laser light under selected irradiating conditions to cause said TiO$_2$ and Co to evaporate from said target and a film of TiO$_2$-Co to epitaxially grow on said heated single crystal substrate;

wherein said film is expressed by: Ti$_{1-x}$Co$_x$O$_2$ where $0<x\leq 0.3$ and wherein a Ti atom at its lattice position is replaced with a Co atom.

10. A method of making a titanium dioxide-cobalt magnetic film, as set forth in claim 9, characterized is that said selected oxygen pressure ranges between 10$^{-5}$ and 10$^{-6}$ Torr, said selected substrate temperature ranges between 500 and 700° C., said selected laser light is a KrF-excimer laser fight applied in the form of a succession of laser pulses, and said selected irradiating conditions include a per pulse power density of said laser light ranging from 1 to 2 joules/cm$^3$ and a rate of irradiation with the laser pulses ranging between 1 and 10 Hz.

11. A method of making a titanium dioxide-cobalt magnetic film, as set forth in claim 10, characterized in that it further comprises preparing a second target composed exclusively of TiO$_2$ and placing said second target in said vacuum chamber, and irradiating the first mentioned target and said second target alternately with laser pulses of said selected laser light at a selected ratio in number corresponding to a selected concentration of Co in TiO$_2$-Co composing said film, thereby permitting a film of TiO$_2$-Co with said selected Co concentration to grow on said heated single crystal substrate.

12. A titanium dioxide-cobalt magnetic film made by a method of making a titanium dioxide-cobalt magnetic film, as set forth in claim 10.

13. A photocatalyst using a titanium dioxide-cobalt magnetic film as set forth in any one of claims 1 to 3 or 12.

14. A semiconductor material having a magnetic function, the material using a titanium dioxide-cobalt magnetic film a set forth in any one of claims 1 to 3 or 12.

15. A transparent magnet using a titanium dioxide-cobalt magnetic film as set forth in any one of claims 1 to 3 or 12.

* * * * *